(12) United States Patent
Kanezaki

(10) Patent No.: US 9,998,084 B2
(45) Date of Patent: Jun. 12, 2018

(54) NOISE FILTER

(71) Applicant: MURATA MANUFACTURING CO., LTD., Kyoto-fu (JP)

(72) Inventor: Akio Kanezaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 14 days.

(21) Appl. No.: 15/205,350

(22) Filed: Jul. 8, 2016

(65) Prior Publication Data

US 2016/0322951 A1    Nov. 3, 2016

Related U.S. Application Data

(63) Continuation of application No. PCT/JP2014/082819, filed on Dec. 11, 2014.

(30) Foreign Application Priority Data

Jan. 17, 2014   (JP) .................. 2014-006690

(51) Int. Cl.
   *H03H 1/00*      (2006.01)
   *H01G 4/30*      (2006.01)
   (Continued)

(52) U.S. Cl.
   CPC ............ *H03H 1/0007* (2013.01); *H01G 2/06* (2013.01); *H01G 4/228* (2013.01); *H01G 4/232* (2013.01);
   (Continued)

(58) Field of Classification Search
   CPC ............ H01G 4/232; H01G 4/30; H01G 4/38; H01G 2/06; H03H 1/007; H03H 2001/0085; H03H 1/0007
   (Continued)

(56) References Cited

U.S. PATENT DOCUMENTS

2012/0256704 A1\* 10/2012 Johnson ............... A61N 1/3718
                                                    333/185

FOREIGN PATENT DOCUMENTS

JP    2003-282348 A    10/2003
JP    2007-305642 A    11/2007
   (Continued)

OTHER PUBLICATIONS

Foreign Translation of JP2011-249412A, Tanaka Daisuke, Dec. 8, 2011.\*

(Continued)

*Primary Examiner* — Rakesh Patel
(74) *Attorney, Agent, or Firm* — Studebaker & Brackett PC

(57) ABSTRACT

A front-surface-side 3-terminal capacitor and a rear-surface-side 3-terminal capacitor are disposed respectively on a front surface and a rear surface of a circuit substrate at opposing positions. A first outer terminal and a second outer terminal of the front-surface-side 3-terminal capacitor are electrically connected to hot-side conductor patterns and, respectively. Third outer terminals and of the rear-surface-side 3-terminal capacitor are electrically connected to ground-side conductor patterns and, respectively. Third outer terminals and of the front-surface-side 3-terminal capacitor are electrically connected to a first outer terminal and a second outer terminal of the rear-surface-side 3-terminal capacitor by employing vias and, respectively. The front-surface-side 3-terminal capacitor and the rear-surface-side 3-terminal capacitor are thereby electrically connected in series.

3 Claims, 7 Drawing Sheets

(51) Int. Cl.
| | |
|---|---|
| *H01G 4/232* | (2006.01) |
| *H01G 4/35* | (2006.01) |
| *H01G 4/38* | (2006.01) |
| *H01G 2/06* | (2006.01) |
| *H01G 4/228* | (2006.01) |
| *H01G 4/40* | (2006.01) |
| *H05K 1/02* | (2006.01) |
| *H05K 1/11* | (2006.01) |
| *H05K 1/18* | (2006.01) |

(52) U.S. Cl.
CPC ............... *H01G 4/30* (2013.01); *H01G 4/35* (2013.01); *H01G 4/38* (2013.01); *H01G 4/40* (2013.01); *H05K 1/0296* (2013.01); *H05K 1/115* (2013.01); *H05K 1/181* (2013.01); *H03H 2001/0014* (2013.01); *H03H 2001/0085* (2013.01); *H05K 2201/10015* (2013.01)

(58) Field of Classification Search
USPC ........... 333/182, 185, 181; 361/299.1, 299.2, 361/299.3, 301.4, 306.1, 306.3, 307, 361/308.1, 329, 330
See application file for complete search history.

(56) References Cited

FOREIGN PATENT DOCUMENTS

| | | |
|---|---|---|
| JP | 2009-032821 A | 2/2009 |
| JP | 2011-249412 A | 12/2011 |

OTHER PUBLICATIONS

International Search Report issued in PCT/JP2014/082819; dated Mar. 17, 2015.
Written Opinion issued in PCT/JP2014/082819; dated Mar. 17, 2015.
International Preliminary Report on Patentability issued in PCT/JP2014/082819; dated Jul. 19, 2016.

\* cited by examiner

NOISE FILTER

CROSS REFERENCE TO RELATED APPLICATIONS

This application claims benefit of priority to Japanese Patent Application 2014-006690 filed Jan. 17, 2014, and to International Patent Application No. PCT/JP2014/082819 filed Dec. 11, 2014, the entire content of which is incorporated herein by reference.

TECHNICAL FIELD

The present disclosure relates to a noise filter suitable for use in suppressing power-supply noise.

BACKGROUND

In a generally known example of a noise filter for a power supply, a 2-terminal capacitor or a 3-terminal capacitor is connected between a hot line and a ground line (see, e.g., Japanese Unexamined Patent Application Publication No. 2003-282348).

SUMMARY

In the noise filter disclosed in Japanese Unexamined Patent Application Publication No. 2003-282348, however, only one capacitor is connected between the hot line and the ground line. Therefore, the disclosed noise filter does not have a failsafe function, and it includes a risk that short-circuiting may occur between the hot side and the ground side, for example, if the capacitor is cracked. Meanwhile, the failsafe function can be realized by connecting a plurality of capacitors in series between the hot line and the ground line. However, inductance is generated not only inside each capacitor, but also in a connecting line that interconnects the plurality of capacitors. Thus, in the case of connecting the plurality of capacitors in series, a problem may arise in that an equivalent serial inductance (ESL) increases and the performance of noise reduction in a high-frequency band degrades unless due consideration is paid to the above point.

The present disclosure has been accomplished in view of the above-described problem, and an object of the present disclosure is to provide a noise filter that has the failsafe function, and that can ensure a noise reduction effect even in a high-frequency band.

(1) To solve the above-described problem, the present disclosure provides a noise filter including a 3-terminal capacitor mounted to a circuit substrate that includes a hot-side conductor pattern and a ground-side conductor pattern, the 3-terminal capacitor comprising a bare chip body, a through electrode disposed inside the bare chip body, an inner electrode disposed inside the bare chip body in an opposing relation to the through electrode, a first outer terminal and a second outer terminal disposed respectively on opposite end surfaces of the bare chip body and electrically connected to the through electrode, and at least one third outer terminal disposed on lateral surfaces of the bare chip body and electrically connected to the inner electrode. The 3-terminal capacitor is disposed on each of a front surface and a rear surface of the circuit substrate at opposing positions. One of the hot-side conductor pattern and the ground-side conductor pattern is electrically connected to the first outer terminal and the second outer terminal of the 3-terminal capacitor that is disposed on the front surface of the circuit substrate. The other of the hot-side conductor pattern and the ground-side conductor pattern is electrically connected to the third outer terminal of the 3-terminal capacitor that is disposed on the rear surface of the circuit substrate. The third outer terminal of the 3-terminal capacitor disposed on the front surface of the circuit substrate is electrically connected to the first outer terminal and the second outer terminal of the 3-terminal capacitor disposed on the rear surface of the circuit substrate by employing at least one via that is formed in the circuit substrate. The 3-terminal capacitor disposed on the front surface of the circuit substrate and the 3-terminal capacitor disposed on the rear surface of the circuit substrate are electrically connected in series between the hot-side conductor pattern and the ground-side conductor pattern.

In the noise filter according to the present disclosure, the 3-terminal capacitor disposed on the front surface of the circuit substrate and the 3-terminal capacitor disposed on the rear surface of the circuit substrate are electrically connected in series. Therefore, even when short-circuiting occurs, for example, upon cracking of one of the 3-terminal capacitors due to, e.g., vibration, insulation between the hot-side conductor pattern and the ground-side conductor pattern can be held by the other 3-terminal capacitor, and the failsafe function can be realized.

Furthermore, in the noise filter according to the present disclosure, the 3-terminal capacitors are disposed respectively on the front surface and the rear surface of the circuit substrate at the opposing positions, and the 3-terminal capacitor disposed on the front surface of the circuit substrate and the 3-terminal capacitor disposed on the rear surface of the circuit substrate are electrically connected to each other by employing at least one via that is formed in the circuit substrate. With such an arrangement, the two 3-terminal capacitors disposed on the opposite surfaces of the circuit substrate can be connected to each other through the via that serves as a connecting line. Therefore, a length of the connecting line between the two 3-terminal capacitors can be shortened, and an inductance of the connecting line can be reduced in comparison with, for example, the case where the two 3-terminal capacitors are disposed only on the front surface of the circuit substrate. In addition, since the noise filter according to the present disclosure employs the 3-terminal capacitors, inductances inside the capacitors can be reduced in comparison with the case of employing 2-terminal capacitors. As a result, an equivalent series inductance can be reduced, and a noise reduction effect can be obtained over a band including high frequencies.

(2) In the present disclosure, the via is formed repeatedly in the circuit substrate, and the different vias are used to electrically connect the third outer terminal of the 3-terminal capacitor disposed on the front surface of the circuit substrate and the first outer terminal of the 3-terminal capacitor disposed on the rear surface of the circuit substrate, and to electrically connect the third outer terminal of the 3-terminal capacitor disposed on the front surface of the circuit substrate and the second outer terminal of the 3-terminal capacitor disposed on the rear surface of the circuit substrate.

According to the present disclosure, the plural vias are formed in the circuit substrate to electrically connect the 3-terminal capacitor disposed on the front surface of the circuit substrate and the 3-terminal capacitor disposed on the rear surface of the circuit substrate. On that occasion, by arranging, for example, the two 3-terminal capacitors in a state substantially orthogonal to each other, the third outer terminal of the 3-terminal capacitor on the front surface side can be arranged close to the first outer terminal and the second outer terminal of the 3-terminal capacitor on the rear surface side. Therefore, connection between the third outer terminal of the 3-terminal capacitor on the front surface side and the first outer terminal of the 3-terminal capacitor on the rear surface side and connection between the third outer terminal of the 3-terminal capacitor on the front surface side and the second outer terminal of the 3-terminal capacitor on the rear surface side can be easily established by forming the plural vias at positions corresponding to the first outer terminal and the second outer terminal of the 3-terminal capacitor on the rear surface side. As a result, the two 3-terminal capacitors can be connected in series by employing the vias each of which has a short size substantially corresponding to a thickness of the circuit substrate, and hence the equivalent series inductance can be reduced.

Moreover, since the two 3-terminal capacitors are connected in series by employing the plural vias, a plurality of current paths can be formed between the two 3-terminal capacitors. Accordingly, a combined inductance in the case of employing the plural vias can be reduced in comparison with the case where the two 3-terminal capacitors are connected in series by employing one via. As a result, the equivalent series inductance can be reduced, and the noise reduction effect can be obtained over a band including high frequencies.

DETAILED DESCRIPTION

A noise filter according to a first embodiment of the present disclosure will be described in detail below with reference to the drawings.

First, a noise filter 1 according to a first embodiment of the present disclosure is described with reference to FIGS. 1 to 7. FIGS. 1 to 4 illustrate the noise filter 1 according to the first embodiment of the present disclosure. The noise filter 1 includes a circuit substrate 2, hot-side conductor patterns 3A and 3B, ground-side conductor patterns 5A and 5B, connecting electrodes 4A, 4B, 6A and 6B, vias 7A and 7B, 3-terminal capacitors 11 and 21, etc. In the following description, it is assumed that a thickness direction of the circuit substrate 2 is defined as a Z-direction, while a transverse direction and a longitudinal direction along a front surface 2A of the circuit substrate 2 are defined as an X-direction and a Y-direction, respectively.

Figure 1:
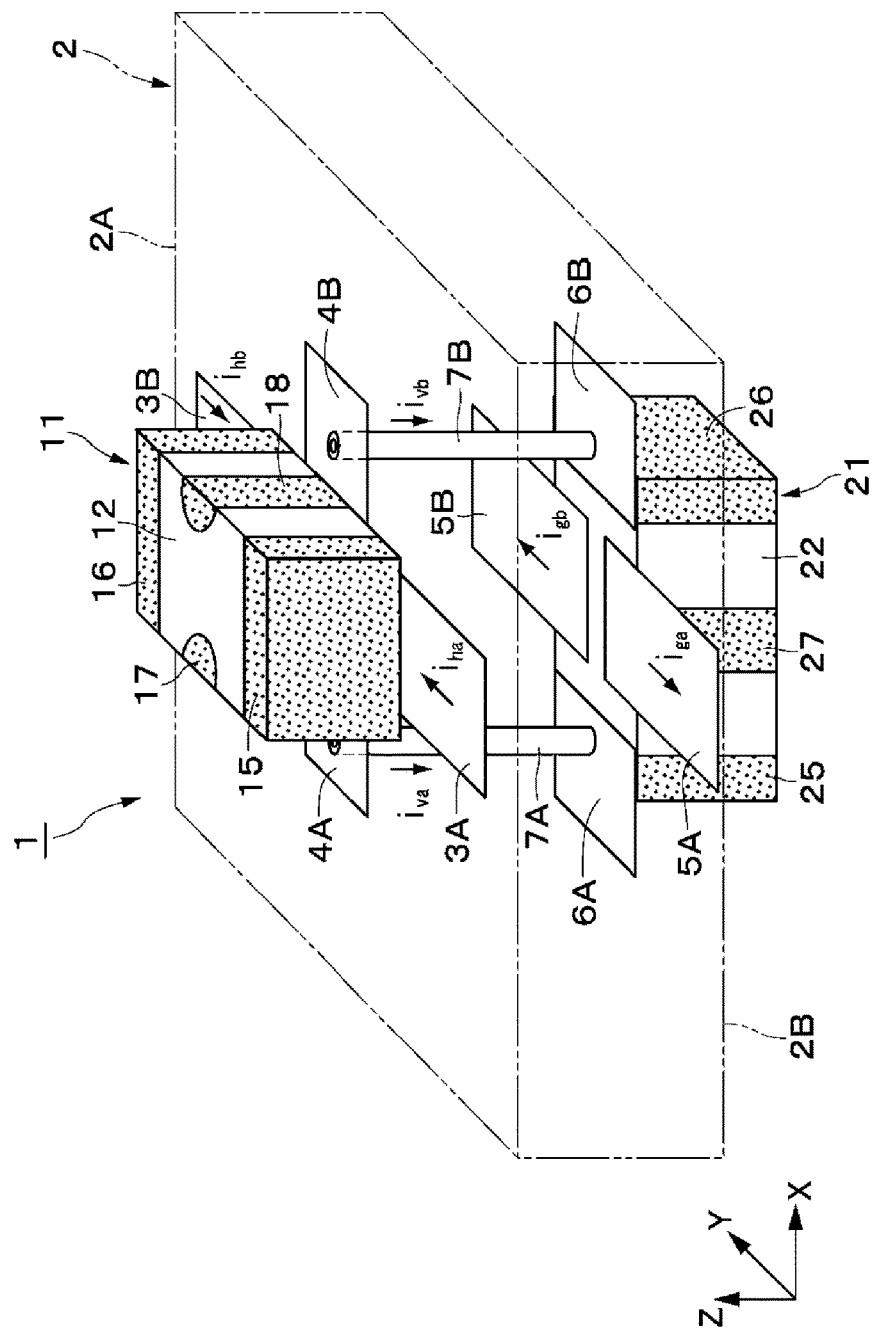
FIG. 1 is a perspective view of a noise filter according to a first embodiment of the present disclosure.
Figure 2:
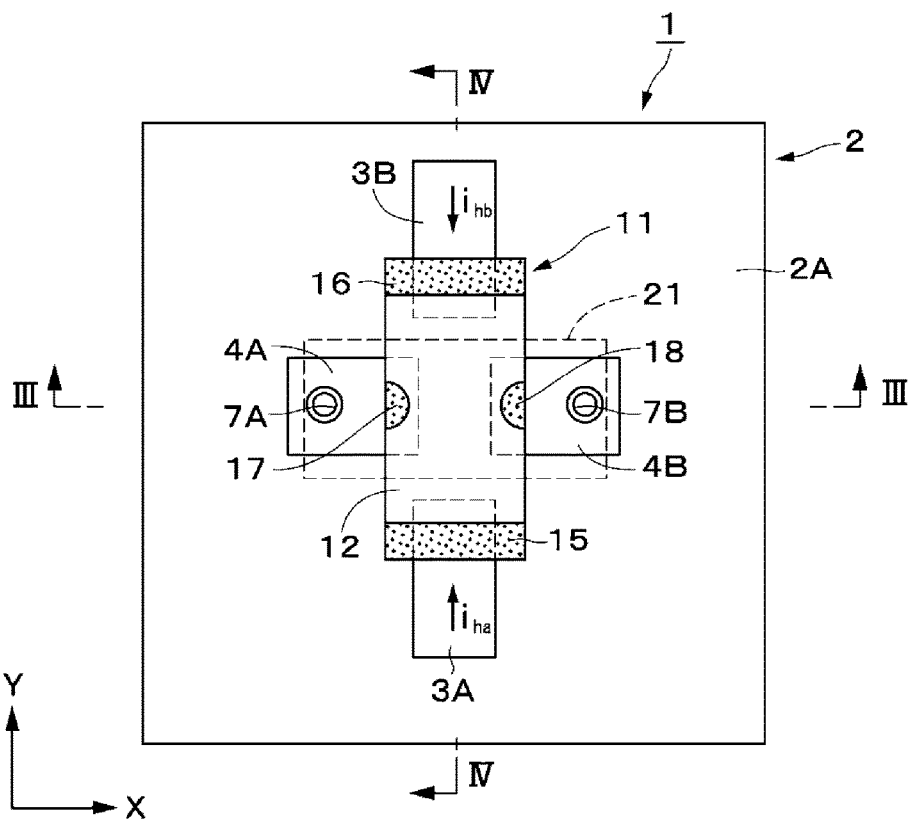
FIG. 2 is a plan view of the noise filter in FIG. 1.

The circuit substrate 2 is formed as a flat plate by employing an insulating material, e.g., an epoxy resin. Two hot-side conductor patterns 3A and 3B and two connecting electrodes 4A and 4B are disposed on the front surface 2A of the circuit substrate 2. As illustrated in FIGS. 1 and 2, the hot-side conductor patterns 3A and 3B extend in the Y-direction, and they are spaced from each other near a central region of the circuit substrate 2. A power supply voltage is supplied to the hot-side conductor patterns 3A and 3B.

As illustrated in FIG. 2, the connecting electrodes 4A and 4B are positioned around the region of the circuit substrate 2 where the hot-side conductor patterns 3A and 3B are spaced from each other. The connecting electrodes 4A and 4B are arranged respectively on one side and the other side (on the left side and the right side in FIG. 2) in the X-direction with the hot-side conductor patterns 3A and 3B interposed therebetween.

Two ground-side conductor patterns 5A and 5B and two connecting electrodes 6A and 6B are disposed on a rear surface 2B of the circuit substrate 2. The ground-side conductor patterns 5A and 5B extend in the Y-direction, and they are spaced from each other near a central region of the circuit substrate 2. The ground-side conductor patterns 5A and 5B are positioned respectively in regions of the circuit substrate 2 opposing to the hot-side conductor patterns 3A and 3B, and are formed substantially parallel to the hot-side conductor patterns 3A and 3B. A ground is connected to the ground-side conductor patterns 5A and 5B.

The connecting electrodes 6A and 6B are positioned around the region of the circuit substrate 2 where the ground-side conductor patterns 5A and 5B are spaced from each other. The connecting electrodes 6A and 6B are arranged respectively on one side and the other side in the X-direction with the ground-side conductor patterns 5A and 5B interposed therebetween. The connecting electrodes 6A and 6B are positioned respectively in regions of the circuit substrate 2 opposing to the connecting electrodes 4A and 4B.

The circuit substrate 2 includes the vias 7A and 7B penetrating the circuit substrate 2 in the thickness direction (Z-direction). As illustrated in FIG. 1, the vias 7A and 7B are each, for example, a through via that is fabricated by forming a conductor over an inner side of a through hole penetrating the circuit substrate 2 with plating. Hence the vias 7A and 7B have electrical conductivity. The vias 7A and 7B electrically connect the two connecting electrodes 4A and 4B, which are disposed on the front surface 2A of the circuit substrate 2, and the two connecting electrodes 6A and 6B, which are disposed on the rear surface 2B of the circuit substrate 2, respectively.

On the front surface 2A and the rear surface 2B of the circuit substrate 2, the 3-terminal capacitors 11 and 21 (hereinafter referred to as the front-surface-side 3-terminal capacitor 11 and the rear-surface-side 3-terminal capacitor 21), each of which is formed of a multilayer ceramic capacitor, are mounted respectively in a state opposing and substantially orthogonal to each other. The front-surface-side 3-terminal capacitor 11 includes a bare chip body 12, through electrodes 13, inner electrodes 14, a first outer terminal 15, a second outer terminal 16, third outer terminals 17 and 18, etc.

The bare chip body 12 is fabricated by laminating ceramic green sheets, which become dielectric layers 12A to 12F, in a thickness direction of the bare chip body 12, and by pressing and firing the laminated ceramic green sheets. The dielectric layers 12A to 12F are each formed in a substantially rectangular parallelepiped shape by employing a dielectric material, e.g., a barium titanate ($BaTiO_3$) based ceramic.

Figure 5:
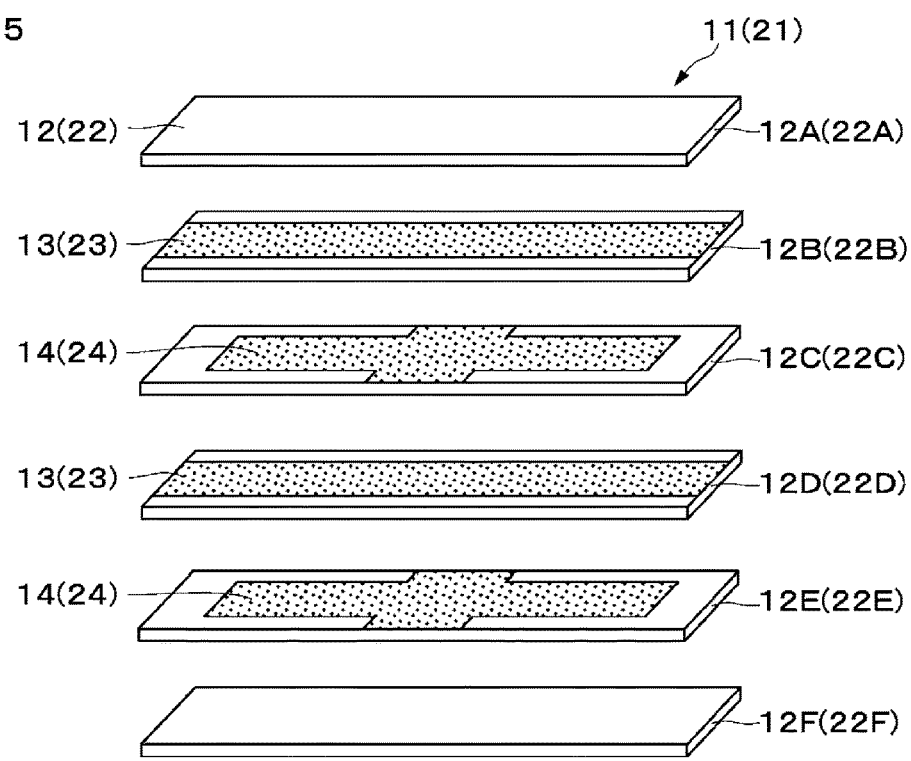
FIG. 5 is an exploded perspective view of a 3-terminal capacitor.

As illustrated in FIG. 5, the through electrodes 13 are disposed between the dielectric layers 12A and 12B and between the dielectric layers 12C to 12D in a state penetrating the interior of the bare chip body 12 in a lengthwise direction of the bare chip body 12 (i.e., in a direction along a long side thereof). Each of the through electrodes 13 has a substantially flat plate shape and extends along the long side of the bare chip body 12. One end of the through electrode 13 in the lengthwise direction is electrically connected to the first outer terminal 15, and the other end of the through electrode 13 in the lengthwise direction is electrically connected to the second outer terminal 16.

Figure 3:
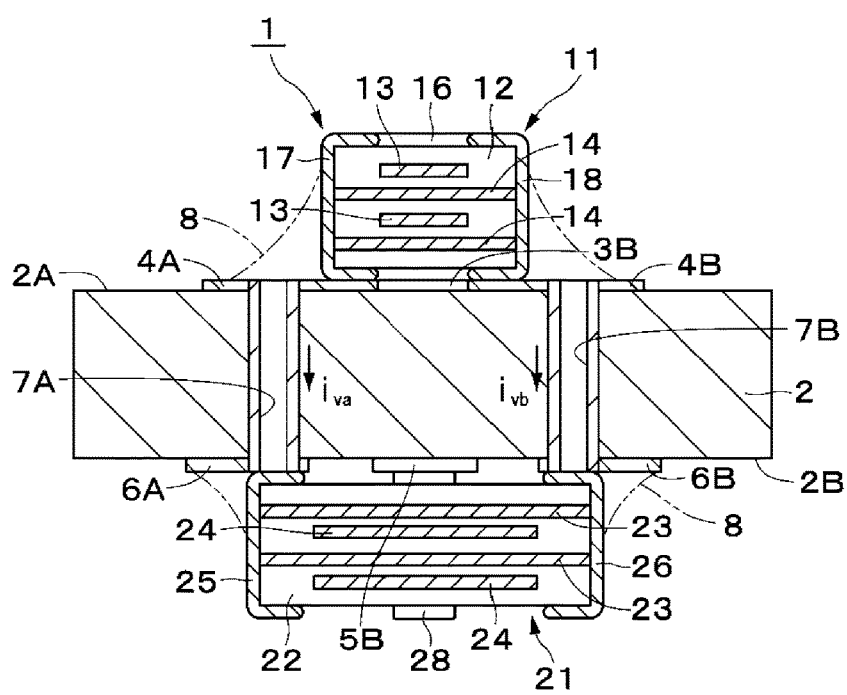
FIG. 3 is a schematic sectional view of the noise filter when looked at from a direction denoted by an arrow III-III in FIG. 2.
Figure 4:
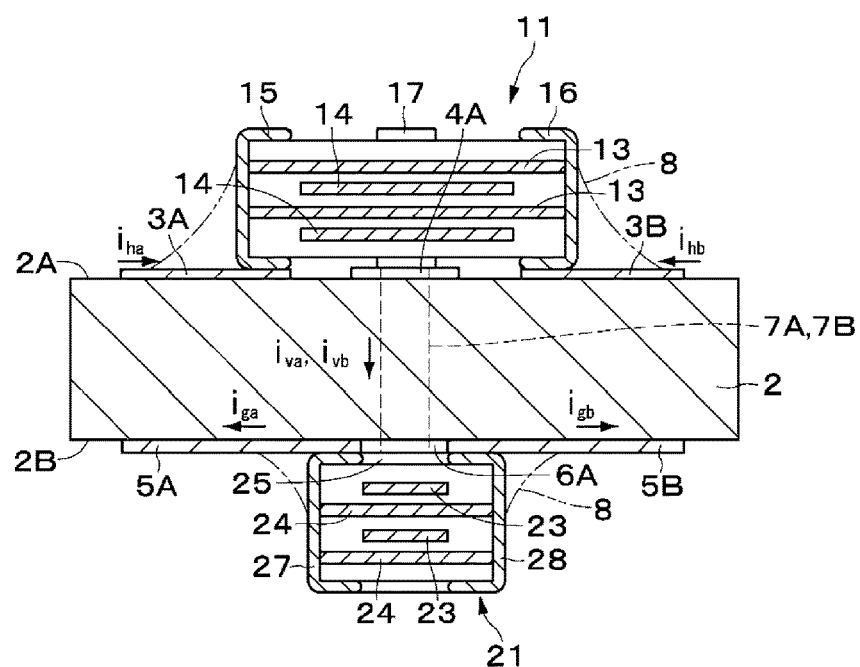
FIG. 4 is a schematic sectional view of the noise filter when looked at from a direction denoted by an arrow IV-IV in FIG. 2.

The inner electrodes 14 each having a substantially flat plate shape are disposed between the dielectric layers 12B and 12C and between the dielectric layers 12D to 12E in an opposing relation to the through electrodes 13. In a central portion of the bare chip body 12 in the lengthwise direction, each of the inner electrodes 14 penetrates the interior of the bare chip body 12 in a widthwise direction of the bare chip body (i.e., in a direction along a short side thereof), and it spreads in the lengthwise direction of the bare chip body 12 in an opposing relation to the through electrode 13. Thus, the inner electrode 14 is formed in a substantially crossed shape. As illustrated in FIG. 3, opposite ends of the inner electrode 14 in the widthwise direction are electrically connected to the third terminals 17 and 18. In this embodiment, the through electrodes 13 and the inner electrodes 14 are each formed as, e.g., a conductive metal thin film.

The first outer terminal 15 is disposed on one end surface of the bare chip body 12 in the lengthwise direction and is electrically connected to the through electrodes 13. The second outer terminal 16 is disposed on the other end surface of the bare chip body 12 in the lengthwise direction and is electrically connected to the through electrodes 13.

The third outer terminals 17 and 18 are disposed respectively on lateral surfaces of the bare chip body 12, the lateral surfaces being orthogonal to the opposite end surfaces where the first outer terminal 15 and the second outer terminal are disposed, and they are electrically connected to the inner electrodes 14. In this embodiment, the outer terminals 15 to 18 are each formed, for example, by coating, e.g., a Ni plating layer on a sintered electrode layer that is made of a conductive metal.

On the other hand, the rear-surface-side 3-terminal capacitor 21 is disposed on the rear surface 2B of the circuit substrate 2. The rear-surface-side 3-terminal capacitor 21 includes a bare chip body 22 made up of dielectric layers 22A to 22F, through electrodes 23, inner electrodes 24, a first outer terminal 25, a second outer terminal 26, third outer terminals 27 and 28, etc.

In this embodiment, the rear-surface-side 3-terminal capacitor 21 is constituted substantially in the same structure as that of the front-surface-side 3-terminal capacitor 11. Accordingly, the bare chip body 22, the through electrodes 23, the inner electrodes 24, the first outer terminal 25, the second outer terminal 26, and the third outer terminals 27 and 28 of the rear-surface-side 3-terminal capacitor 21 correspond respectively to the bare chip body 12, the through electrodes 13, the inner electrodes 14, the first outer terminal 15, the second outer terminal 16, and the third outer terminals 17 and 18 of the front-surface-side 3-terminal capacitor 11. Therefore, detailed description of the above components of the rear-surface-side 3-terminal capacitor 21 is omitted.

It is to be noted that the numbers of the dielectric layers 12A to 12F and 22A to 22F, the numbers of the through electrodes 13 and 23, and the numbers of the inner electrodes 14 and 24 are not limited to those illustrated in FIGS. 1 to 5, and they may be appropriately set depending on specifications, etc. Furthermore, the front-surface-side 3-terminal capacitor 11 and the rear-surface-side 3-terminal capacitor 21 are not always required to be the same. Both the capacitors may have different electrostatic capacities, for example, by setting the numbers of the through electrodes 13 and 23 and the numbers of the inner electrodes 14 and 24 to be different from each other.

Mounted states of the front-surface-side 3-terminal capacitor 11 and the rear-surface-side 3-terminal capacitor 21 with respect to the circuit substrate 2 will be described below.

The front-surface-side 3-terminal capacitor 11 is surface-mounted to the front surface 2A of the circuit substrate 2. At that time, the first outer terminal 15 and the second outer terminal 16 are bonded respectively to the hot-side conductor patterns 3A and 3B by solders 8, for example, and the third outer terminals 17 and 18 are bonded respectively to the connecting electrodes 4A and 4B by solders 8, for example. As a result, the first outer terminal 15 is electrically connected to the one hot-side conductor pattern 3A, and the second outer terminal 16 is electrically connected to the other hot-side conductor pattern 3B. Moreover, the two third outer terminals 17 and 18 are electrically connected to the connecting electrodes 4A and 4B, respectively.

On the other hand, the rear-surface-side 3-terminal capacitor 21 is surface-mounted to the rear surface 2B of the circuit substrate 2. At that time, the first outer terminal 25 and the second outer terminal 26 are bonded respectively to the connecting electrodes 6A and 6B by solders 8, for example, and the third outer terminals 27 and 28 are bonded respectively to the ground-side conductor patterns 5A and 5B by solders 8, for example. As a result, the first outer terminal 25 is electrically connected to the one connecting electrode 6A, and the second outer terminal 26 is electrically connected to the other connecting electrode 6B. Moreover, the two third outer terminals 27 and 28 are electrically connected to the ground-side conductor patterns 5A and 5B, respectively. Thus, the front-surface-side 3-terminal capacitor 11 and the rear-surface-side 3-terminal capacitor 21 are electrically connected in series between the hot-side conductor patterns 3A, 3B and the ground-side conductor patterns 5A, 5B.

On that occasion, the electrical connection between the third outer terminal 17 of the front-surface-side 3-terminal capacitor 11 and the first outer terminal 25 of the rear-surface-side 3-terminal capacitor 21 and the electrical connection between the third outer terminal 18 of the front-surface-side 3-terminal capacitor 11 and the second outer terminal 26 of the rear-surface-side 3-terminal capacitor 21 are established by employing the different vias 7A and 7B, respectively. In more detail, the one third outer terminal 17 of the front-surface-side 3-terminal capacitor 11 is electrically connected to an upper end of the via 7A through the connecting electrode 4A. A lower end of the via 7A is electrically connected to the first outer terminal 25 of the rear-surface-side 3-terminal capacitor 21 through the connecting electrode 6A.

Meanwhile, the other third outer terminal 18 of the front-surface-side 3-terminal capacitor 11 is electrically connected to an upper end of the via 7B through the connecting electrode 4B. A lower end of the via 7B is electrically connected to the second outer terminal 26 of the rear-surface-side 3-terminal capacitor 21 through the connecting electrode 6B. With such a configuration, the rear-surface-side 3-terminal capacitor 21 can be arranged on a line vertically extending from the front-surface-side 3-terminal capacitor 11, and the two 3-terminal capacitors 11 and 21 can be connected in series by employing the vias 7A and 7B each of which has a short size substantially corresponding to the thickness of the circuit substrate 2.

The noise filter 1 according to this embodiment is constituted as described above, and an operation of the noise filter 1 will be described below.

For example, a hot line on the power supply side is connected to the one hot-side conductor pattern 3A, and a hot line on the side including devices (not illustrated) is connected to the other hot-side conductor pattern 3B. A ground line is connected to the ground-side conductor patterns 5A and 5B. As a result, a power supply voltage is supplied to the hot-side conductor patterns 3A and 3B, and the ground-side conductor patterns 5A and 5B are held at a ground potential.

When a power-supply DC current is supplied to the hot line, the DC current is supplied to the individual devices through the one hot-side conductor pattern 3A, the first outer terminal 15, the through electrodes 13, the second outer terminal 16, and the other hot-side conductor pattern 3B of the front-surface-side 3-terminal capacitor 11. At that time, because the hot-side conductor patterns 3A and 3B and the ground-side conductor patterns 5A and 5B are insulated by the 3-terminal capacitors 11 and 21, the DC current does not flow into the ground-side conductor patterns 5A and 5B.

On the other hand, as illustrated in FIGS. 1 to 4, when high-frequency noise currents $i_{ha}$ and $i_{hb}$ (high-frequency currents) are applied to the hot-side conductor patterns 3A and 3B, the noise currents $i_{ha}$ and $i_{hb}$ enter the inner electrodes 14 from the through electrodes 13 of the front-surface-side 3-terminal capacitor 11, and then flow toward the connecting electrodes 4A and 4B through the third outer terminals 17 and 18 after being each branched into two paths. A noise current $i_{va}$ flowing out from the third outer terminal 17 flows, as one current path, toward the first outer terminal 25 of the rear-surface-side 3-terminal capacitor 21 through the connecting electrode 4A, the via 7A, and the connecting electrode 6A. Meanwhile, a noise current $i_{vb}$ flowing out from the third outer terminal 18 flows, as the other current path, toward the second outer terminal 26 of the rear-surface-side 3-terminal capacitor through the connecting electrode 4B, the via 7B, and the connecting electrode 6B. The noise currents $i_{va}$ and $i_{vb}$ applied to the rear-surface-side 3-terminal capacitor 21 through the two current paths, as described above, enter the inner electrodes 24 from the through electrodes 23 of the rear-surface-side 3-terminal capacitor 21, and then flow out, as noise currents $i_{ga}$ and $i_{gb}$, from the third outer terminals 27 and 28 after being each branched into two paths. Those two noise currents $i_{ga}$ and $i_{gb}$ flow toward the ground-side conductor patterns 5A and 5B from the third outer terminals 27 and 28, respectively.

Figure 6:
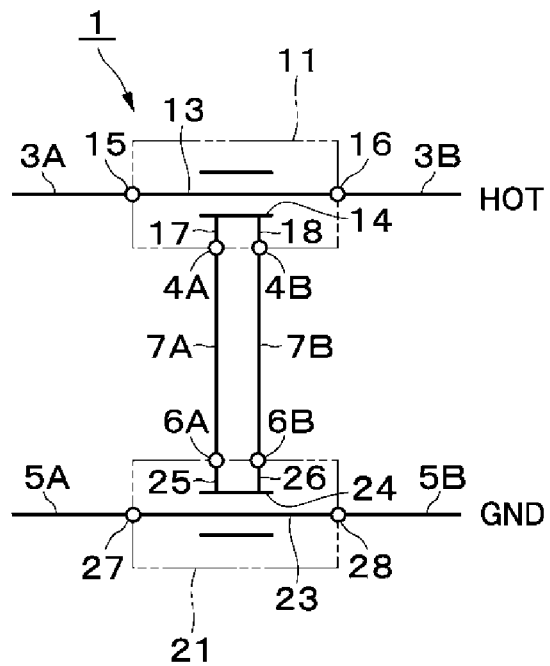
FIG. 6 is an equivalent circuit diagram of the noise filter.

Here, an equivalent circuit of the noise filter 1 is as per illustrated in FIG. 6. In FIG. 6, because hot lines (HOT) on both sides are interconnected by the through electrodes 13 of the front-surface-side 3-terminal capacitor 11, the DC current passes, as it is, through the interior of the front-surface-side 3-terminal capacitor 11. On the other hand, the front-surface-side 3-terminal capacitor 11 and the rear-surface-side 3-terminal capacitor 21 are connected in series between the hot line (HOT) and a ground line (GND). Therefore, the noise currents are applied to the rear-surface-side 3-terminal capacitor 21 through the vias 7A and 7B, and then flow toward the ground line. As a result, the noise filter 1 can remove the noise currents flowing in the hot line.

With the configuration described above, since the front-surface-side 3-terminal capacitor 11 and the rear-surface-side 3-terminal capacitor 21 are disposed on the opposite surfaces of the circuit substrate 2 respectively, an inductance of connecting lines can be reduced in comparison with the case where the two 3-terminal capacitors are disposed only on the front surface of the circuit substrate. This results from the feature that the front-surface-side 3-terminal capacitor 11 and the rear-surface-side 3-terminal capacitor 21 can be connected by the use of the vias 7A and 7B through a short distance, which substantially corresponds to the thickness of the circuit substrate 2, without routing the connecting lines on the circuit substrate 2.

Furthermore, since the noise filter 1 employs the 3-terminal capacitors 11 and 21, inductances inside the capacitors can be reduced and an equivalent series inductance can be reduced in comparison with the case of employing 2-terminal capacitors. The reason is that an inductance of each of the through electrodes 13 and 23 functions as an inductance of a T-type filter, and the third outer terminals 17, 18 and 27, 28 are connected in parallel to opposite lateral ends of the 3-terminal capacitors 11 and 21, respectively, whereby the equivalent series inductance is reduced.

Figure 7:
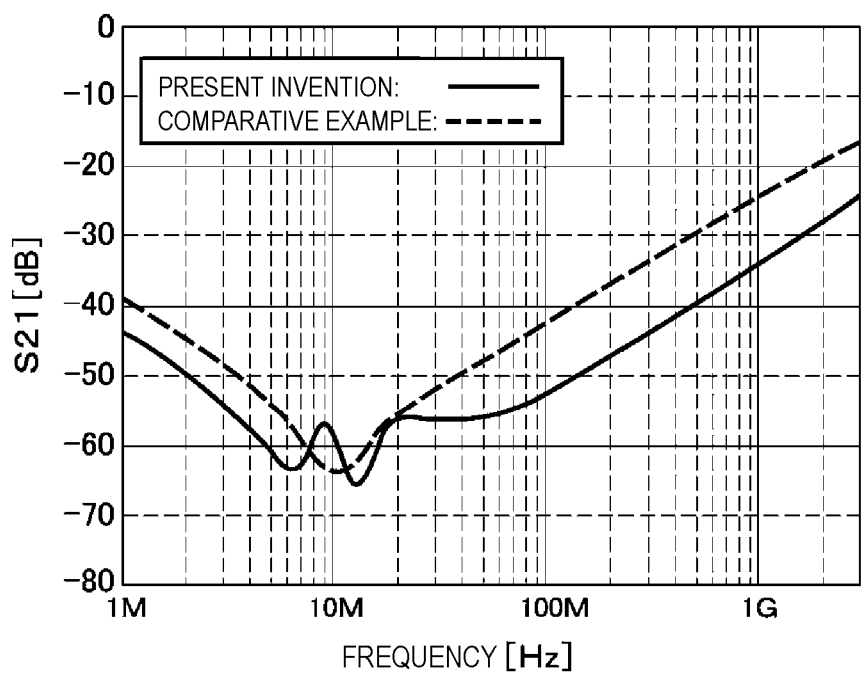
FIG. 7 is a characteristic chart depicting frequency characteristics of S21 in the first embodiment of the present disclosure and a comparative example.

To confirm the above-described effect, frequency characteristics of S21 of the S (Scattering) parameter representing an insertion loss was determined for the noise filter 1 according to the embodiment by simulation. The result is depicted in FIG. 7. FIG. 7 further depicts frequency characteristics similarly determined in the case of connecting existing 2-terminal capacitors in series between the hot line and the ground line, as a comparative example, for comparison with the result of the noise filter 1 according to the embodiment. An electrostatic capacitance of the 2-terminal capacitors in the comparative example and an electrostatic capacitance of the 3-terminal capacitors 11 and 21 in the embodiment are set to the same value.

As depicted in FIG. 7, in the comparative example using the 2-terminal capacitors, as frequency increases until reaching about 10 MHz, the insertion loss increases; namely the attenuation of noise increases. In the comparative example, however, beyond about 10 MHz, the insertion loss decreases; namely the attenuation of noise decreases. This is presumably attributable to the fact that the equivalent series inductance is affected by a residual inductance inside the capacitors.

Also in the noise filter 1 according to the embodiment, the insertion loss decreases beyond about 10 MHz. In comparison with the comparative example, however, the insertion loss is larger in the entirety. It is understood that, particularly in a high-frequency band of not lower than 100 MHz, the noise reduction effect is improved about 10 dB in comparison with the comparative example. Thus, in the noise filter 1, the insertion loss in the high-frequency band can be increased and the noise reduction effect can be more reliably obtained over a band including high frequencies in comparison with the comparative example as a result of shortening lengths of the connecting lines and employing the 3-terminal capacitors 11 and 21.

According to the first embodiment, as described above, the noise filter 1 includes the front-surface-side 3-terminal capacitor 11 and the rear-surface-side 3-terminal capacitor 21 that are electrically connected in series. Therefore, even when short-circuiting occurs, for example, upon cracking of the front-surface-side 3-terminal capacitor 11 due to, e.g., vibration, the insulation between the hot-side conductor patterns 3A, 3B and the ground-side conductor patterns 5A, 5B can be held by the rear-surface-side 3-terminal capacitor 21, and the failsafe function can be realized. Similarly, even when the rear-surface-side 3-terminal capacitor 21 is short-circuited, the failsafe function can be realized with the presence of the front-surface-side 3-terminal capacitor 11.

Furthermore, in the noise filter 1, the 3-terminal capacitors 11 and 21 are disposed respectively on the front surface 2A and the rear surface 2B of the circuit substrate 2 at the opposing positions, and the front-surface-side 3-terminal capacitor 11 and the rear-surface-side 3-terminal capacitor 21 are electrically connected to each other by employing the vias 7A and 7B that are formed in the circuit substrate 2. With such an arrangement, the two 3-terminal capacitors 11 and 21 disposed on the opposite surfaces of the circuit substrate 2 can be connected to each other through the vias 7A and 7B that serve as connecting lines. Accordingly, lengths of the connecting lines between the two 3-terminal capacitors 11 and 21 can be shortened, and an inductance of the connecting lines can be reduced in comparison with, for example, the case where the two 3-terminal capacitors are disposed only on the front surface of the circuit substrate. In addition, since the noise filter 1 employs the 3-terminal capacitors 11 and 21, inductances inside the capacitors can be reduced in comparison with the case of employing 2-terminal capacitors. In other words, the 3-terminal capacitors 11 and 21 provide a larger insertion loss and a higher noise reduction effect than the 2-terminal capacitors. As a result, the equivalent series inductance of the noise filter 1 can be reduced, and the noise reduction effect can be obtained over a band including high frequencies.

According to the first embodiment, the vias 7A and 7B are formed in the circuit substrate 2 to electrically connect the front-surface-side 3-terminal capacitor 11 and the rear-surface-side 3-terminal capacitor 21. In this case, by arranging the two 3-terminal capacitors 11 and 21 in a state substantially orthogonal to each other, the third outer terminal 17 of the front-surface-side 3-terminal capacitor 11 and the first outer terminal 25 of the rear-surface-side 3-terminal capacitor 21 can be arranged close to each other, and the third outer terminal 18 of the front-surface-side 3-terminal capacitor 11 and the second outer terminal 26 of the rear-surface-side 3-terminal capacitor 21 can be arranged close to each other. Therefore, the connection between the third outer terminal 17 of the front-surface-side 3-terminal capacitor 11 and the first outer terminal 25 of the rear-surface-side 3-terminal capacitor 21 and the connection between the third outer terminal 18 of the front-surface-side 3-terminal capacitor 11 and the second outer terminal 26 of the rear-surface-side 3-terminal capacitor 21 can be easily established by forming the vias 7A and 7B at positions corresponding to the first outer terminal 25 and the second outer terminal 26 of the rear-surface-side 3-terminal capacitor 21. As a result, the two 3-terminal capacitors 11 and 21 can be connected in series by employing the vias 7A and 7B each of which has a short size substantially corresponding to the thickness of the circuit substrate 2, and hence the equivalent series inductance can be reduced.

Moreover, since the front-surface-side 3-terminal capacitor 11 and the rear-surface-side 3-terminal capacitor 21 are connected in series by employing the two vias 7A and 7B, a plurality of current paths can be formed between the 3-terminal capacitors 11 and 21. Accordingly, a combined inductance of the two vias 7A and 7B can be reduced in comparison with the case where the 3-terminal capacitors 11 and 21 are connected in series by employing one via. As a result, the equivalent series inductance can be reduced, and the noise reduction effect can be obtained over a band including high frequencies.

In the noise filter 1, the equivalent series inductance between the front-surface-side 3-terminal capacitor 11 and the rear-surface-side 3-terminal capacitor 21 can be further reduced by optimizing the layout, for example, by increasing the number of the vias 7A and 7B, inserting a plane (electrode layer), which is connected in parallel to the through electrodes 13 and 23, as an inner layer of the circuit substrate 2, and reducing the thickness of the circuit substrate 2.

Figure 8:
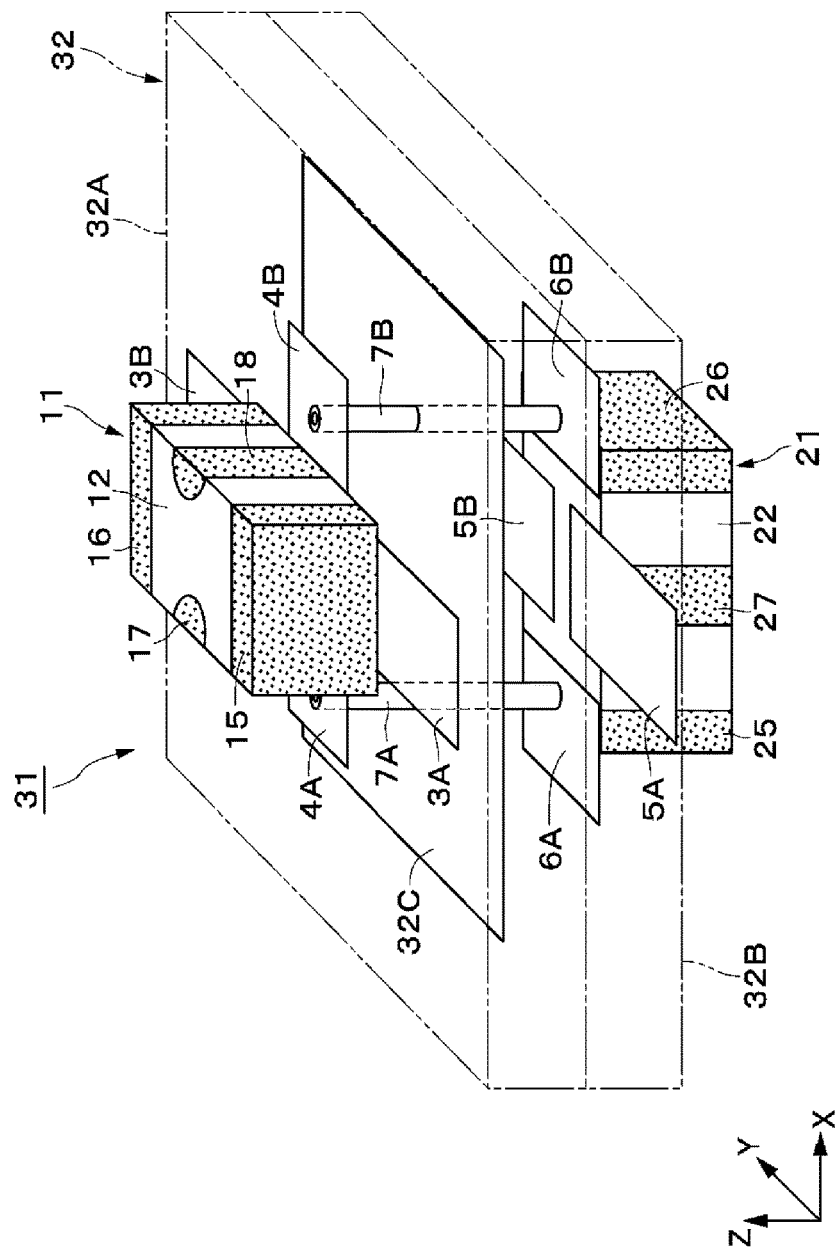
FIG. 8 is a perspective view of a noise filter according to a second embodiment of the present disclosure, the view being looked at from a similar position to that in FIG. 1.
Figure 9:
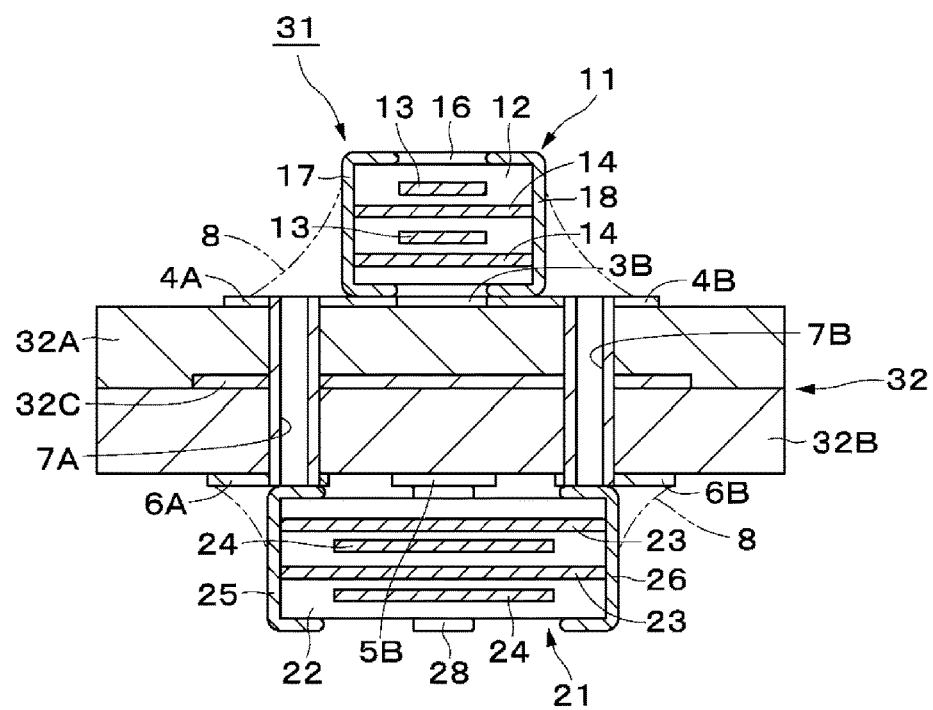
FIG. 9 is a schematic sectional view of the noise filter according to the second embodiment of the present disclosure, the view being looked at from a similar position to that in FIG. 3.

FIGS. 8 and 9 illustrate a noise filter according to a second embodiment of the present disclosure. The second embodiment is featured in that a plane electrode is disposed in a circuit substrate. It is to be noted that, in the second embodiment, the same components as those in the above-described first embodiment are denoted by the same reference signs, and description of those components is omitted.

A noise filter 31 according to the second embodiment includes a circuit substrate 32, the hot-side conductor patterns 3A and 3B, the ground-side conductor patterns 5A and 5B, the connecting electrodes 4A, 4B, 6A and 6B, the vias 7A and 7B, the 3-terminal capacitors 11 and 21, etc.

The circuit substrate 32 is constituted as a multilayer substrate in which a plane electrode 32C is disposed between insulating layers 32A and 32B each made of an insulating material, e.g., an epoxy resin. The plane electrode 32C is formed of a flat plate, by employing, e.g., a conductive thin film, with outer dimensions being enough to cover the 3-terminal capacitors 11 and 21, and it is arranged between the 3-terminal capacitors 11 and 21. Furthermore, the plane electrode 32C is connected to the vias 7A and 7B, which penetrate the circuit substrate 32, at positions midway in the thickness direction of the circuit substrate 32. With such an arrangement, the vias 7A and 7B are electrically connected to each other by the plane electrode 32C.

Thus, the second embodiment can also provide substantially the same advantageous effects as those in the first embodiment.

Figure 10:
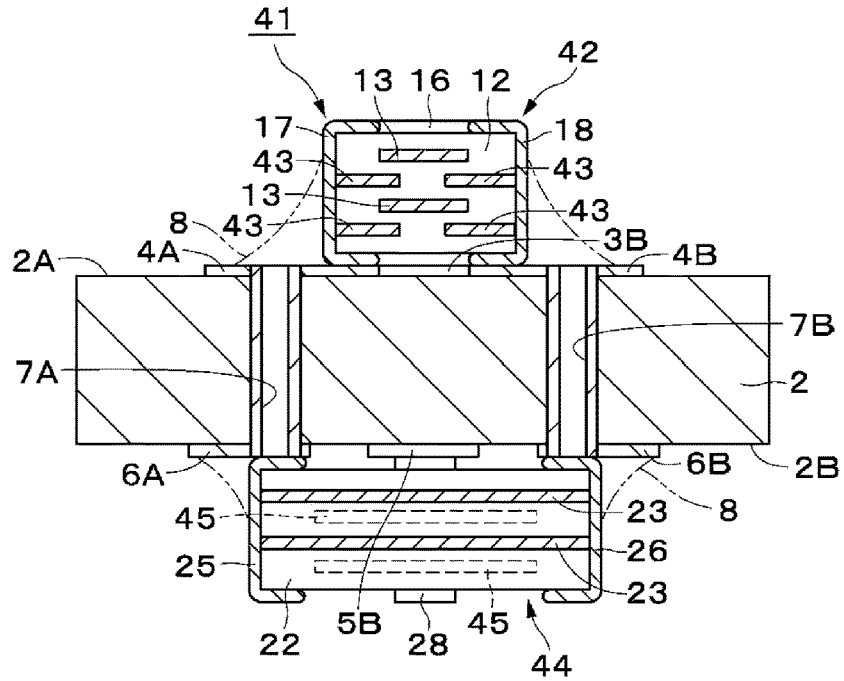
FIG. 10 is a schematic sectional view of a noise filter according to one modification of the present disclosure, the view being looked at from a similar position to that in FIG. 3.

In the above-described first and second embodiments, the inner electrodes 14 and 24 are each formed of a single flat plate. However, the present disclosure is not limited to that case, and the present disclosure may be implemented, for example, like a noise filter 41 according to a first modification, as illustrated in FIG. 10. More specifically, in a front-surface-side 3-terminal capacitor 42, for example, two inner electrodes 43 are arranged in a single layer to be positioned on the opposite end sides thereof in the widthwise direction, and those two inner electrodes 43 are disposed in a spaced state to be not contacted with each other. In such a case, one of the inner electrodes 43 is electrically connected to the third outer terminal 17, and the other inner electrode 43 is electrically connected to the third outer terminal 18. A rear-surface-side 3-terminal capacitor 44 also includes inner electrodes 45 that are constituted substantially in the same arrangement as the inner electrodes 43. In such a case, one of the inner electrodes 45 is electrically connected to the third outer terminal 27, and the other inner electrode 45 is electrically connected to the third outer terminal 28.

Figure 11:
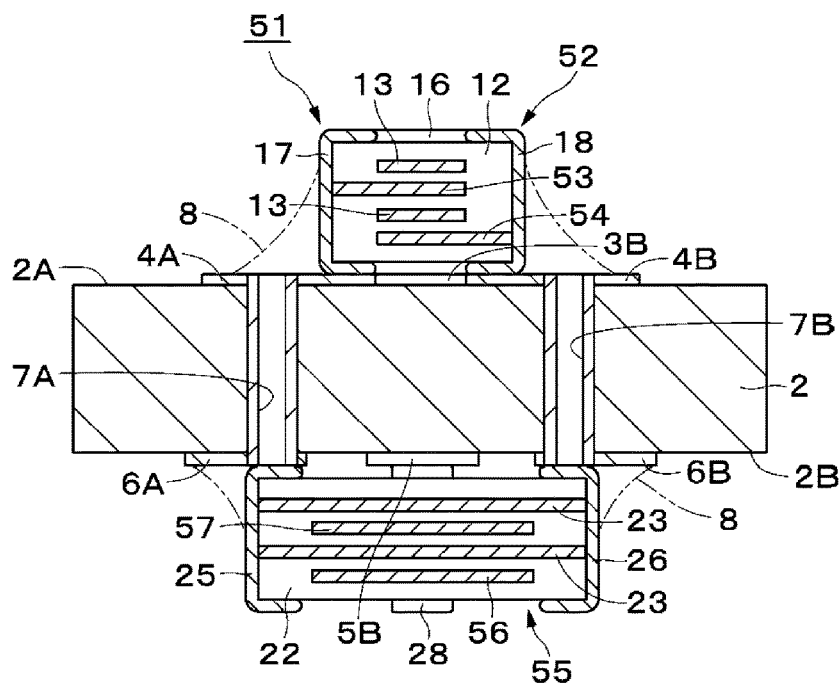
FIG. 11 is a schematic sectional view of a noise filter according to another modification of the present disclosure, the view being looked at from a similar position to that in FIG. 3.

In the above-described first and second embodiments, the inner electrodes 14 and 24 are each connected at their opposite end portions to corresponding two of the third outer terminals 17, 18, 27 and 28. However, the present disclosure is not limited to that case, and the present disclosure may be implemented, for example, like a noise filter 51 according to a second modification, as illustrated in FIG. 11. More specifically, a front-surface-side 3-terminal capacitor 52 includes an inner electrode 53 electrically connected to the third outer terminal 17 and an inner electrode 54 electrically connected to the third outer terminal 18. On that occasion, the inner electrode 53 is arranged in a state spaced from the third outer terminal 18 to be not contacted with the third outer terminal 18. Similarly, the inner electrode 54 is arranged in a state spaced from the third outer terminal 17. In addition, the inner electrodes 53 and 54 are arranged at different positions in the thickness direction, and are alternately disposed in the thickness direction. A rear-surface-side 3-terminal capacitor 55 also includes inner electrodes 56 and 57 that are substantially similar to the inner electrodes 53 and 54. Thus, the inner electrode 56 is electrically connected to the third outer terminal 27 similarly to the inner electrode 53, and the inner electrode 57 is electrically connected to the third outer terminal 28 similarly to the inner electrode 54.

In the above-described first and second embodiments, the hot-side conductor patterns 3A and 3B constituting the hot line are electrically connected to the first outer terminal 15 and the second outer terminal 16 of the front-surface-side 3-terminal capacitor 11, respectively, and the ground-side conductor patterns 5A and 5B constituting the ground line are electrically connected to the third outer terminals 27 and 28 of the rear-surface-side 3-terminal capacitor 21, respectively. However, the present disclosure is not limited to that case. As another example, the ground line may be electrically connected to the first outer terminal and the second outer terminal of the front-surface-side 3-terminal capacitor, and the hot line may be electrically connected to the third outer terminals of the rear-surface-side 3-terminal capacitor.

In the above-described first embodiment, the front-surface-side 3-terminal capacitor 11 and the rear-surface-side 3-terminal capacitor 21 are arranged on the front surface 2A and the rear surface 2B of the circuit substrate 2, respectively, in a state substantially orthogonal to each other. However, the present disclosure is not limited to that case. As another example, the front-surface-side 3-terminal capacitor and the rear-surface-side 3-terminal capacitor may be arranged on the front surface and the rear surface of the circuit substrate, respectively, in a state substantially parallel to each other. The above point is similarly applied to the second embodiment as well.

In the above-described first embodiment, the two vias 7A and 7B are formed in the circuit substrate 2. However, the present disclosure is not limited to that case. As another example, only one via may be formed in the circuit substrate. Alternatively, three or more vias may be formed to electrically connect the front-surface-side 3-terminal capacitor and the rear-surface-side 3-terminal capacitor. In any case, the conductor patterns disposed on the circuit substrate may be arranged such that the front-surface-side 3-terminal capacitor and the rear-surface-side 3-terminal capacitor are electrically connected in series. The above point is similarly applied to the second embodiment as well.

In the above-described first and second embodiments, the pairs of third outer terminals 17, 18 and 27, 28 of the 3-terminal capacitors 11 and 21 are each separately disposed on two lateral surfaces of a corresponding one of the bare chip bodies 12 and 22. However, the present disclosure is not limited to that case. As another example, the third outer terminals disposed on the two lateral surfaces of the bare chip body of the 3-terminal capacitor may be connected to each other to be provided as one common third outer terminal as a whole.

The invention claimed is:

1. A noise filter comprising:
   first and second 3-terminal capacitors mounted to a circuit substrate that includes a hot-side conductor pattern and a ground-side conductor pattern, each of the first and second 3-terminal capacitors including: a bare chip body, a through electrode disposed inside the bare chip body, an inner electrode disposed inside the bare chip body in an opposing relation to the through electrode, a first outer terminal and a second outer terminal disposed respectively on opposite end surfaces of the bare chip body and electrically connected to the through electrode, and at least one third outer terminal disposed on lateral surfaces of the bare chip body and electrically connected to the inner electrode;
   the first and second 3-terminal capacitors being respectively disposed on a front surface and a rear surface of the circuit substrate at opposing positions,
   one of the hot-side conductor pattern and the ground-side conductor pattern is electrically connected to the first outer terminal and the second outer terminal of the first 3-terminal capacitor that is disposed on the front surface of the circuit substrate,
   the other of the hot-side conductor pattern and the ground-side conductor pattern is directly and electrically connected to the at least one third outer terminal of the second 3-terminal capacitor that is disposed on the rear surface of the circuit substrate,
   the at least one third outer terminal of the first 3-terminal capacitor disposed on the front surface of the circuit substrate is electrically connected to the first outer terminal and the second outer terminal of the second 3-terminal capacitor disposed on the rear surface of the circuit substrate by employing at least one via that is formed in the circuit substrate, and
   the first 3-terminal capacitor disposed on the front surface of the circuit substrate and the second 3-terminal capacitor disposed on the rear surface of the circuit substrate are electrically connected in series between the hot-side conductor pattern and the ground-side conductor pattern.

2. The noise filter according to claim 1, wherein the at least one via includes a plurality of the vias is formed in the circuit substrate, and
   the plurality of vias are used to electrically connect the at least one third outer terminal of the first 3-terminal capacitor disposed on the front surface of the circuit substrate and the first outer terminal of the second 3-terminal capacitor disposed on the rear surface of the circuit substrate, and to electrically connect the at least one third outer terminal of the first 3-terminal capacitor disposed on the front surface of the circuit substrate and the second outer terminal of the second 3-terminal capacitor disposed on the rear surface of the circuit substrate.

3. The noise filter according to claim 1, wherein the at least one third outer terminal of the first 3-terminal capacitor disposed on the front surface of the circuit substrate and the first outer second terminal and the second outer terminal of the 3-terminal capacitor disposed on the rear surface of the circuit substrate are electrically connected with the at least one via interposed therebetween.

\* \* \* \* \*